United States Patent [19]

Mahoney et al.

[11] 4,418,319

[45] Nov. 29, 1983

[54] SIGNAL PROCESSING PRODUCT CIRCUITRY

[75] Inventors: Paul F. Mahoney, Brighton; Jerrold L. Bonn, Waltham, both of Mass.

[73] Assignee: Signatron, Inc., Lexington, Mass.

[21] Appl. No.: 396,047

[22] Filed: Jul. 7, 1982

Related U.S. Application Data

[63] Continuation-in-part of Ser. No. 103,347, Dec. 13, 1979, Pat. No. 4,352,029.

[51] Int. Cl.³ .......................... H03K 3/26; G06G 7/16
[52] U.S. Cl. ................................. 328/160; 307/317 R; 307/319; 332/43 B; 455/108
[58] Field of Search ............... 307/319, 317, 310, 260; 328/160; 333/103, 218; 455/108; 332/43 B

[56] References Cited

U.S. PATENT DOCUMENTS

| | | | |
|---|---|---|---|
| 3,019,983 | 2/1962 | Philbrick | 328/160 |
| 3,371,160 | 2/1968 | Hurford | 328/160 |
| 3,492,501 | 1/1970 | Allen et al. | 333/103 |
| 4,016,516 | 4/1977 | Sauter et al. | 333/103 |
| 4,224,583 | 9/1980 | Larkin | 333/103 |

*Primary Examiner*—Stanley D. Miller
*Assistant Examiner*—B. P. Davis
*Attorney, Agent, or Firm*—Robert F. O'Connell

[57] ABSTRACT

Signal processing circuitry, preferably for use in multiplying two input signals, one at RF frequency and one at baseband frequency, which includes at least a basic four branch bridge circuit having a diode connected in each branch in a generally symmetrical four branch circuit configuration using a single bias supply and including a trimming resistor in at least one branch for controlling the current through the diodes in such branch so that the characteristics of the diodes in all branches can be matched over substantially the complete range of control current values therefor.

18 Claims, 8 Drawing Figures

SIGNAL PROCESSING PRODUCT CIRCUITRY

This application is a continuation-in-part of application Ser. No. 103,347, filed Dec. 13, 1979 now U.S. Pat. No. 4,352,029 issued Sept. 29, 1982.

INTRODUCTION

This invention relates generally to signal processing circuitry and, more particularly, to circuitry which can be utilized to form the product of two input signals, preferably a base-band signal and radio frequency (RF) signal.

BACKGROUND OF THE INVENTION

In many signal processing applications it is desirable to combine two input signals so as to provide the product thereof. For example, it may be necessary in some signal processing systems to form the product of an input radio frequency (RF) signal and a base-band signal. Such signal processing often is required in modem systems, in array antenna systems, in systems using adaptive equalizer circuitry which requires complex multipliers, in interference cancellation systems, or in systems requiring the use of phase shifting circuitry. In such cases it is usually required that a linear multiplication operation be provided over a wide range of input signal levels.

One such circuit which might be considered for use for such purposes is described in U.S. Pat. No. 3,550,041, issued to W. A. Sauter on Dec. 22, 1970. Such patent describes the use of two PIN diodes in a bridge circuit arrangement. While the patent primarily discusses the use of such circuitry for regulating the amplitude of an RF signal with fine resolution over a large dynamic range by utilizing a DC control signal, such circuitry could be adapted for use in forming a product of an RF input signal and the DC control signal.

However, several disadvantages of the circuit disclosed by the Sauter patent arise in this connection. First of all, the circuit requires two bias voltage supplies, one a positive bias supply and the other a negative voltage supply, such bias supply means thereby comprising two independent bias sources for each of the two diodes involved, as disclosed and claimed in the patent. Not only does the requirement for two bias power supplies increase the cost of the overall device, but also the circuit becomes relatively highly sensitive even to small changes in the power supply voltages from either of the bias sources. Such undesired sensitivity arises because the circuit is in a bridge configuration and a change in the power supply level of a bias source affects only the corresponding branch of the bridge, not changing both branches equally.

Another disadvantage is that the Sauter circuit requires the use of substantially exactly matched diodes for its operation over a wide range of control currents. However, no effective technique for adjusting the bias currents to provide such an exact match is suggested by Sauter. If the usual method of matching PIN diodes is utilized, i.e., where a bias current is inserted so that at some value of control current the two diodes have the same resistance, such matching technique does not provide for a match of the diode characteristics over the entire range of control currents which may be involved.

A further disadvantage of the Sauter circuit arises in that the circuit cannot be easily compensated for temperature effects without unbalancing the bridge circuit and thereby adversely affecting its operation.

Hence, the Sauter circuit is not effective in providing linear characteristics for the multiplication of two input signals over a relatively wide range of input signal levels.

BRIEF SUMMARY OF THE INVENTION

The invention utilizes a bridge circuit configuration of PIN diodes which overcomes the disadvantages of the Sauter arrangement. In accordance with the invention the bridge circuit is arranged so that only a single bias power supply is required, such a configuration not only reducing the overall cost thereof but also assuring that the circuit is much less sensitive to changes in power supply voltages and can be effectively compensated for temperature changes.

Further, the bridge circuitry of the invention is arranged to provide means for controlling the current through one of the diodes in a manner such that the diode characteristics of both diodes can be matched over a wide range of control currents rather than merely providing a match at only one value thereof. By using suitably selected circuit component values for the particular applications in which the circuit is to be used, the configuration thereof permits the useful voltage range of the input signals thereto to be compatible with most signal processing circuits with which the circuit can be used, such as conventional operational amplifiers, which may have a voltage range of ±10 volts, for example.

DESCRIPTION OF THE INVENTION

The invention can be described in more detail with the help of the accompanying drawing wherein.

Figure 1:
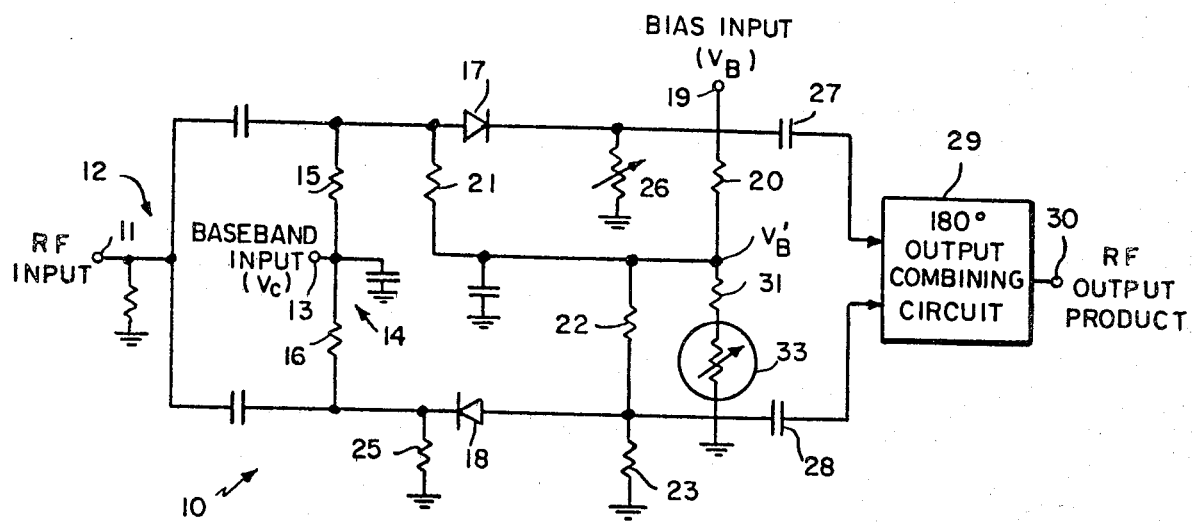
FIG. 1 shows a preferred embodiment of the invention for use in providing the product of two input signals.

As can be seen in FIG. 1, a first RF input signal is supplied to the circuitry of the invention at an input terminal 11 through suitable input circuitry 12 to the anode of a first PIN diode 17 and simultaneously to the cathode of a second PIN diode 18. A second input signal, for example, a base-band signal, is supplied at an input terminal 13 to the anode and cathode of diodes 17 and 18, respectively, via suitable input circuitry 14 which includes resistors 15 and 16.

A bias voltage $V_B$ is applied at a bias input terminal 19 to the anodes of both diodes 17 and 18 via a common resistor 20 and bias resistors 21 and 22, respectively. Resistor 23 is connected from the anode of diode 18 to ground. The outputs from diodes 17 and 18 are supplied to an output combining circuit 29 via capacitors 27 and 28 respectively, combining circuit 29 providing an RF output product signal which represents the product of the RF input signal and the base-band input signal. An output combining circuit, for example, which can be used herein may comprise a suitable center-tapped, balanced transformer circuit, as would be well known to those in the art.

Figure 2:
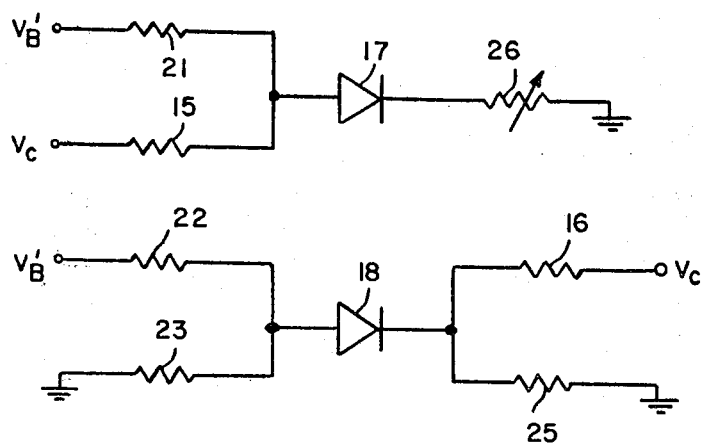
FIG. 2 shows in more simplified diagrammatic form the balanced diode arrangement of the circuit of FIG. 1.

The generally symmetrical arrangement of the diodes can be better understood in the simplified diagram of FIG. 2 wherein the connections of the diodes 17 and 18 to the single bias input source and to the base-band input signal are shown. Thus, the anodes of each of the diodes are connected to one end of input resistors 21 and 22, respectively, the other ends thereof being effectively connected to the bias voltage $V_B$. The anode of diode 17 is also connected via resistor 15 to base-band input signal $V_C$ while the anode of diode 18 is also connected via resistor 23 to ground.

The cathode of diode 17 is connected through variable resistor 26 to ground. The cathode of diode 18 is connected via resistance 16 to base-band input signal $V_C$ and also via resistor 25 to ground. In the circuit of the invention once the diodes 17 and 18 are effectively matched by selecting the desired value of variable resistor 26, the variable resistor can be replaced by a fixed resistor for any specific circuit application.

Figure 3:
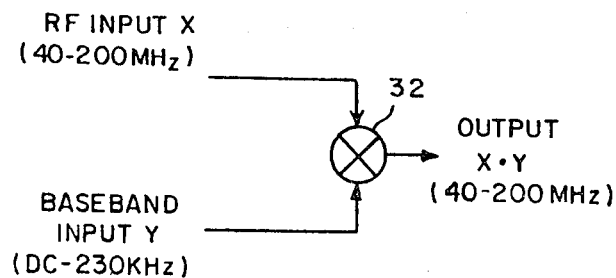
FIG. 3 shows a simplified diagrammatic diagram depicting the multiplier operation of the circuit configuration of FIG. 1.

As shown in FIG. 3, if one desires to multiply an RF input signal X and a base-band input signal Y, the circuitry of the invention effectively acts as a multiplier 32 which produces the product X·Y. An exemplary multiplier in accordance with such principles of operation can be used to provide an appropriate product output for RF input signals over a frequency range from 40 to 200 MHz and for base-band input signals over a frequency range from DC to 230 kHz. It is found that the modulating frequency range and the low end of the RF frequency range are determined primarily by the diode carrier lifetime. A relatively long carrier lifetime limits the maximum modulation while a very short carrier lifetime produces RF non-linearity at low RF frequencies. If a shorter carrier lifetime were used, for example, the modulating range and the carrier range could be scaled upwards.

The use of a single bias input source makes the overall circuit of FIG. 1 relatively insensitive to changes in bias input supply voltage and permits the circuit to be easily and effectively adapted to provide for compensation for insertion loss variations due to temperature changes. Thus, in the circuitry of FIG. 1 a thermistor 33 can be used in series with resistance 31 (alternatively, in some applications the thermistor can be used without the need for a separate resistance in series therewith). Changes in temperature cause appropriate changes to occur in the thermistor resistance, as is well-known, to provide appropriate changes in the bias voltages applied to diodes 17 and 18 to compensate therefor.

The use of a variable trimming resistor 26 permits the desired matching of diode characteristics. The significance of matching the diodes by such technique rather than by the usual method of inserting a bias current, as discussed above, can be best seen by considering the following expressions for the diode resistances as a function of the bias current:

$$R_{17} = \frac{K_{17}}{I^\alpha}$$

$$R_{18} = \frac{K_{18}}{I^\alpha}$$

Where $R_{17}$ and $R_{18}$ are the RF resistances of diodes 17 and 18, respectively, typically $\alpha = 0.87$, and $K_{17}$ and $K_{18}$ are constants associates with the diodes. The constant K in each case varies widely from diode to diode, but the constant $\alpha$ remains relatively the same for all diode types and is normally about the value indicated above.

If the matching of PIN diodes is performed by the usual method of inserting an additional bias current through one of the diodes, the two diodes are found to have the same resistance at one value of the control currents therethrough and the above expressions are as follows:

$$R'_{17} = K_{17}/(I_0 + \Delta I)^{.87} = R_{18},$$

only when $I = I_0$ where $I_0$ is the selected value of control currents.

However, using the trimming technique of the invention, as discussed above, the current through one of the diodes is varied by a factor B so that the above expressions for the diode resistances are as follows:

$$R''_{17} = K_{17}/(BI)^{.87} = \frac{K_{18}}{I^{.87}} = R_{18}$$

for all values of I. Accordingly, such technique permits the matching of the diodes over the entire range of control currents. The practical advantage of such a technique is that the diodes do not have to be selected as carefully for the circuit in order to achieve a given level of perfomance, since diodes which do not match as closely as required for other circuit arrangements can still be used herein with appropriate adjustment of the resistor 26 to achieve the desired matching of their characteristics over the entire control current range.

In a particular successfully used circuit the PIN diodes utilized have a carrier life time of about 1 microsecond. After the diodes are installed, an appropriate measurement can be made which determines the value for resistors 26 in order to trim out any residual unbalance between the diodes.

Other circuit embodiments using the basic concept of the invention as discussed above with reference to FIGS. 1–3 are shown in FIGS. 4–8 and are described in more detail below. Although such embodiments are more complex than that shown in FIG. 1, they appear to improve the operating characteristics desired while retaining the same general biasing arrangement discussed above and utilizing the signals therein in the same general manner.

Figure 4:
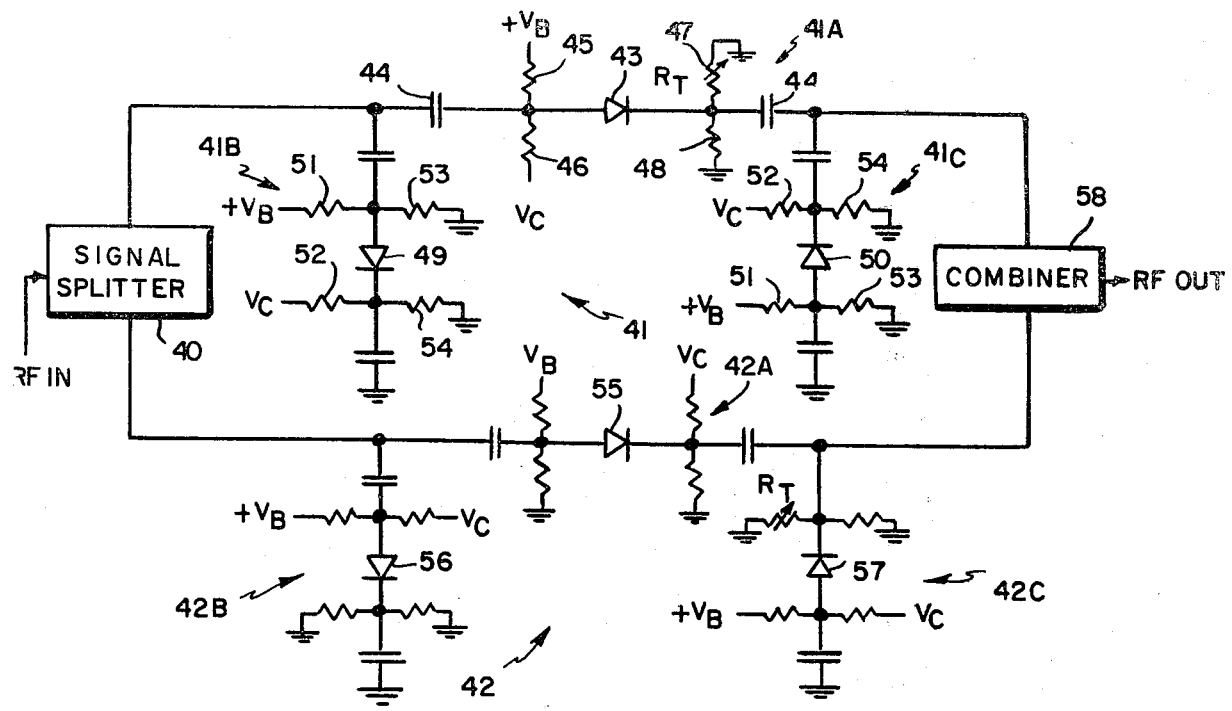
FIGS. 4–8 are more complex embodiments of the basic invention of FIGS. 1–3.

As can be seen in the circuitry of FIG. 4, for example, the same RF input signal is supplied to two pi-network configurations 41 and 42. A single RF input signal, for example is supplied to a signal splitter 40 from which is derived a first input signal component supplied to an upper pi-network 41 and a second input signal component (in phase with the first input signal component) to a lower pi-network 42. Each pi-network has three branches, or legs, the center branch 41A of the upper network 41 having a diode 43 isolated on either side by capacitance 44, a first pair of resistors 45 and 46 which are connected to the desired bias voltage $V_B$ and the baseband input signal $V_C$, respectively, and a second pair of resistors 47 and 48 each connected to ground, as shown. One of the resistors, e.g., resistor 47, can be used as a trimming resistor ($R_T$), in a manner similar to that discussed with respect to FIG. 1.

Branches 41B and 41C each have the bias voltage $V_B$ and the baseband signal $V_C$ connected to opposite sides of diodes 49 and 50 via suitable resistors 51 and 52, respectively, and thence to ground via resistors 53 and 54, respectively. Appropriate isolating capacitances are also used therein.

In a similar manner lower pi-network 42 has a center branch 42A having bias voltage $V_B$ and baseband input signal $V_C$ connected at either side of diode 55, in the same manner as in upper branches 41B and 41C, while in lower branches 42B and 42C the bias voltage and the baseband input signal are connected to diodes 56 and 57 in the same manner as in upper branch 41A.

The RF output signal is formed from the signal component outputs from the upper and lower pi-networks which are suitably combined (out of phase) at a combiner circuit 58. Such configuration presents an effectively constant impedance looking into the overall network from either the input or the output terminals thereof, the impedance seen by the RF input and RF output being effectively more constant with respect to the baseband signal $V_C$ so as to provide an improved frequency response for the overall circuit.

Figure 5:
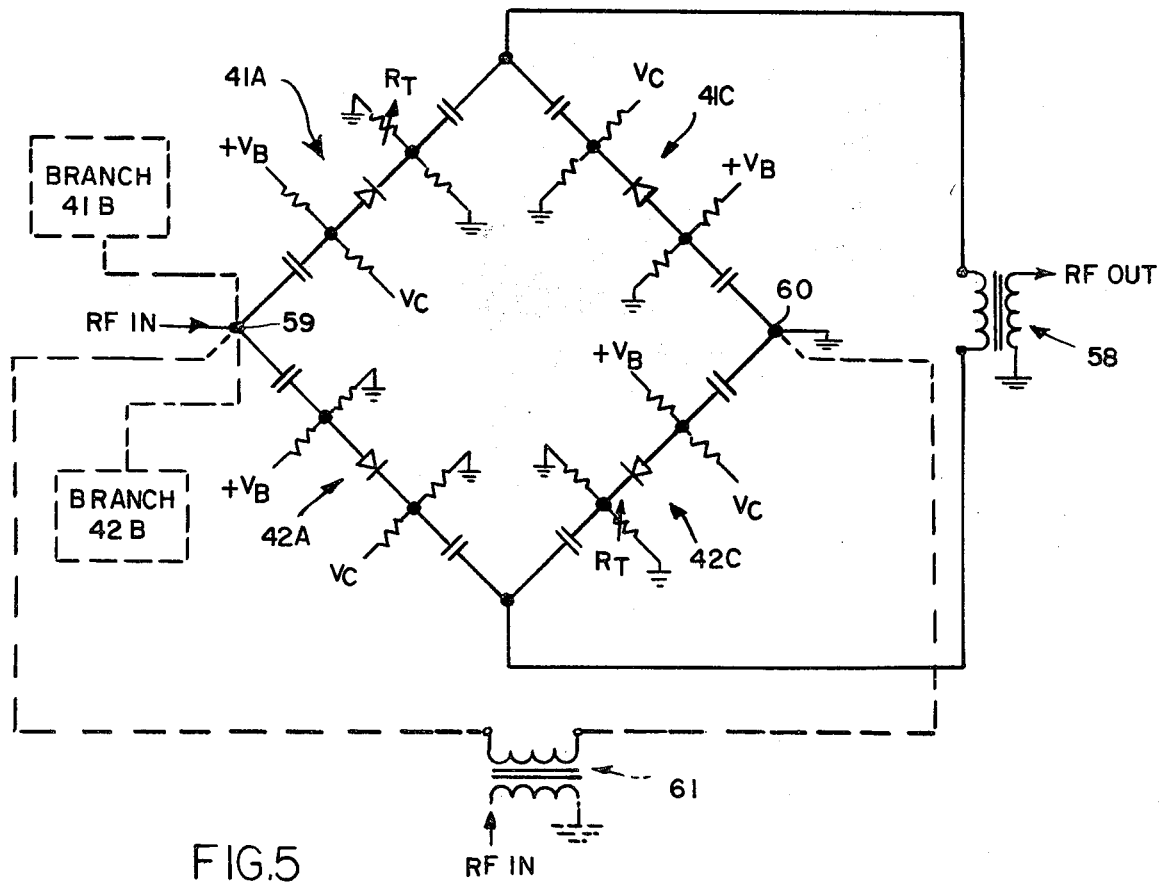

A further variation of the general pi-network scheme of FIG. 4 is shown in FIG. 5 which effectively represents the pi-network configuration of FIG. 4 with the input branches 41B and 42B removed and which can use a single-ended or a double-ended RF input signal. Removal of branches 41B and 42B permits the remaining configuration to be readily recognizable as a bridge circuit as depicted in FIG. 5. Looking at the configuration in another way, the pi-network configuration of FIG. 4 is, in effect, the bridge circuit of FIG. 5 with additional circuits (i.e., branches 41B and 42B) connected from the input terminal 59 to ground. The correspondence between FIG. 5 and FIG. 4 is depicted in FIG. 5 by showing the branches 41B and 42B in phantom. Branches 41A, 41C, 42A, 42C are also specifically identified therein as forming the overall bridge circuit.

In the simplified configuration of FIG. 5 the impedance is effectively constant looking in from the RF input signal but may not be constant looking in from RF output signal. While the frequency response may be somewhat adversely affected, such effect may be relatively small and readily acceptable in many applications, the complexity of the pi-network of FIG. 4 being considerably reduced.

As can be seen in FIG. 5, the input terminals of the pi-network configurations effectively coincide at terminal 59 and a single RF input signal (single-ended) is supplied thereto (terminal 60 is grounded). Alternatively, the bridge circuit thereof may be adapted for use with a double-ended input signal (as shown by the dashed lines at terminals 59 and 60) which is supplied via transformer 61 acting to provide out-of-phase signals at its secondary to the input terminals 59 and 60. The latter double-balanced configuration tends to provide improved operation for reducing higher order harmonics in the output signals. The output combiner 58 is depicted, for example, by the output transformer configuration shown.

It should be noted that a further simplification of the configuration of FIG. 5 by the removal of branches 41C and 42C effectively reduces the circuitry to that shown in FIG. 1 with a single-ended input signal.

Figure 6:
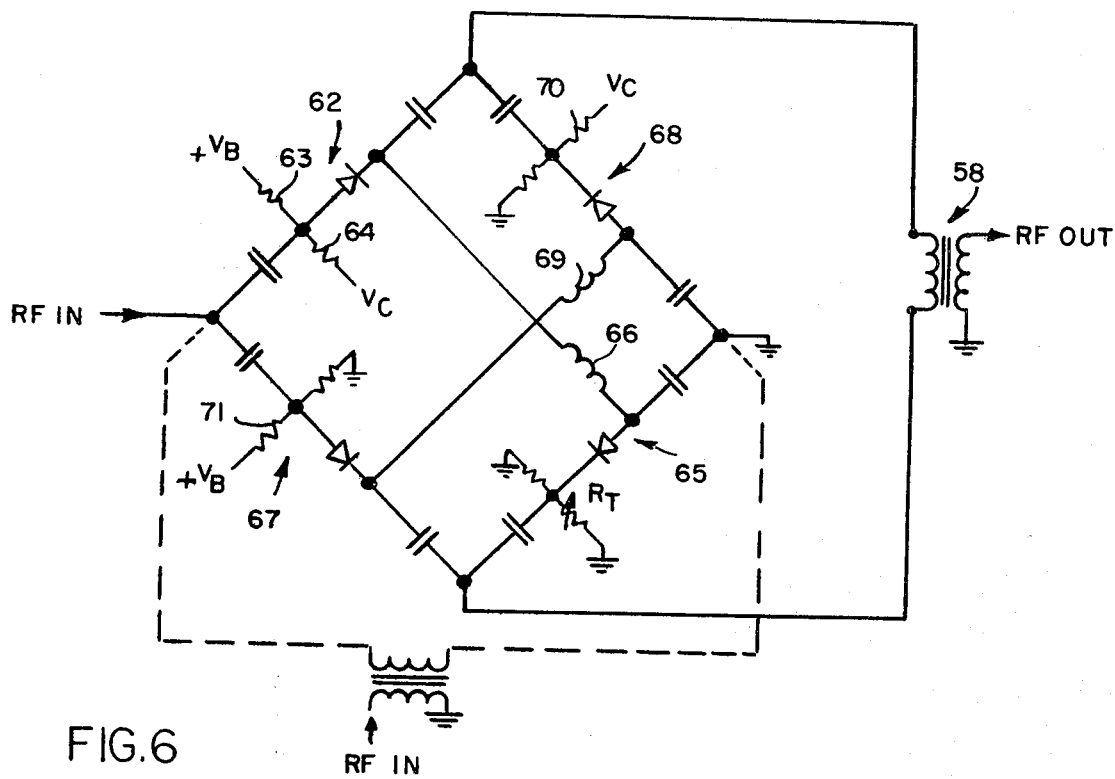

The bridge circuit of FIG. 5 can be further simplified in the manner shown in FIG. 6 by supplying the bias voltage $V_B$ and the baseband input signal $V_C$ to only two legs thereof via a single resistance network in each case. Thus, in one case $V_B$ and $V_C$ are supplied to leg 62 via resistances 63 and 64 and thence to opposite leg 65 via inductance 66. In the other case $V_B$ is supplied to leg 67 via resistance 71 and thence to leg 68 via inductance 69. $V_C$ is supplied to leg 68 via resistance 70 and thence to leg 67 via the same inductance element. Accordingly, in FIG. 6, four resistance networks of FIG. 5 have been eliminated and replaced by the inductances 66 and 69 which provide inductive coupling between opposite legs of the bridge.

Figure 7:
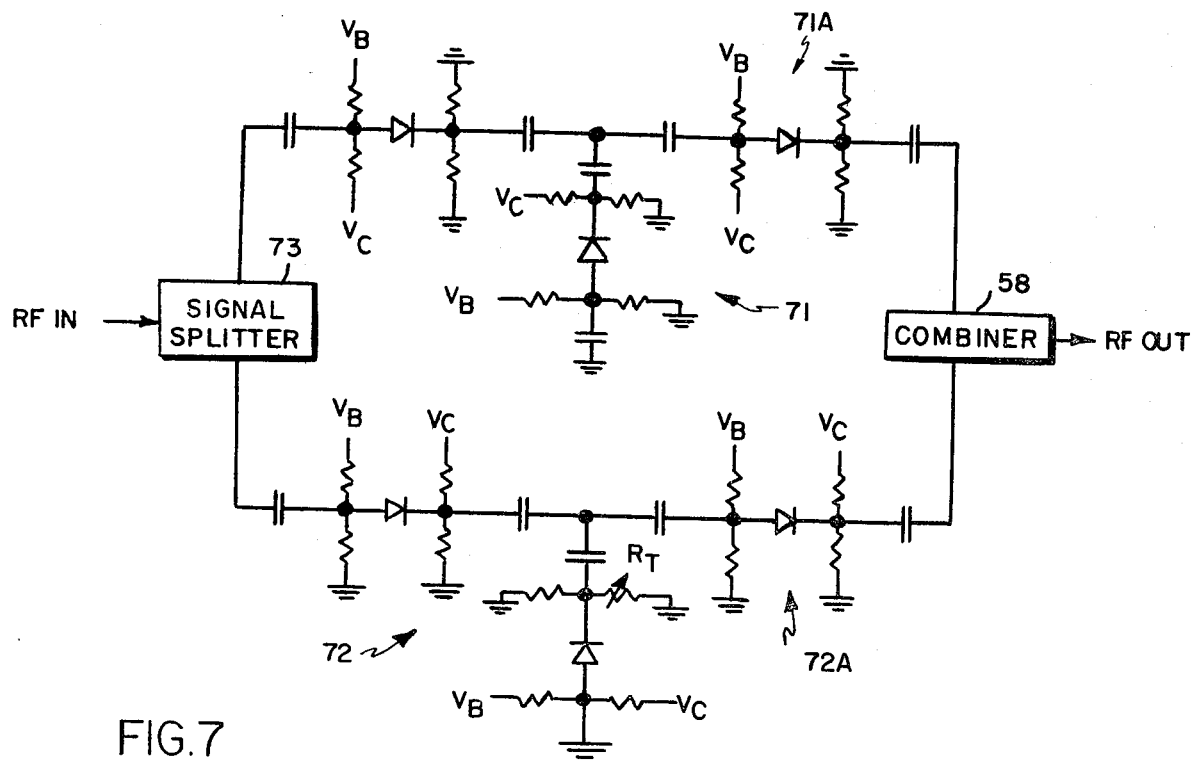

A further alternative embodiment of circuitry in accordance with the invention is shown in FIG. 7 which effectively represents a T-network version of the pi-network of FIG. 4, both the upper T-network 71 and the lower T-network 72 being supplied with the RF input signal via signal splitter 73 and the RF output signal being produced at the output of combiner circuit 74 in the same manner as discussed with reference to FIG. 4. Moreover, as further discussed with reference to FIG. 4, the T-network reduces to the bridge circuit of FIG. 5 for a single-ended input signal if the output legs 71A and 72A are eliminated. Again, looked at from another viewpoint, the T-network configuration of FIG. 7 is, in effect, the bridge circuit of FIG. 5 with branches 71A and 72A connected in series from the output terminals of the bridge to each end of the output transformer 58.

Figure 8:
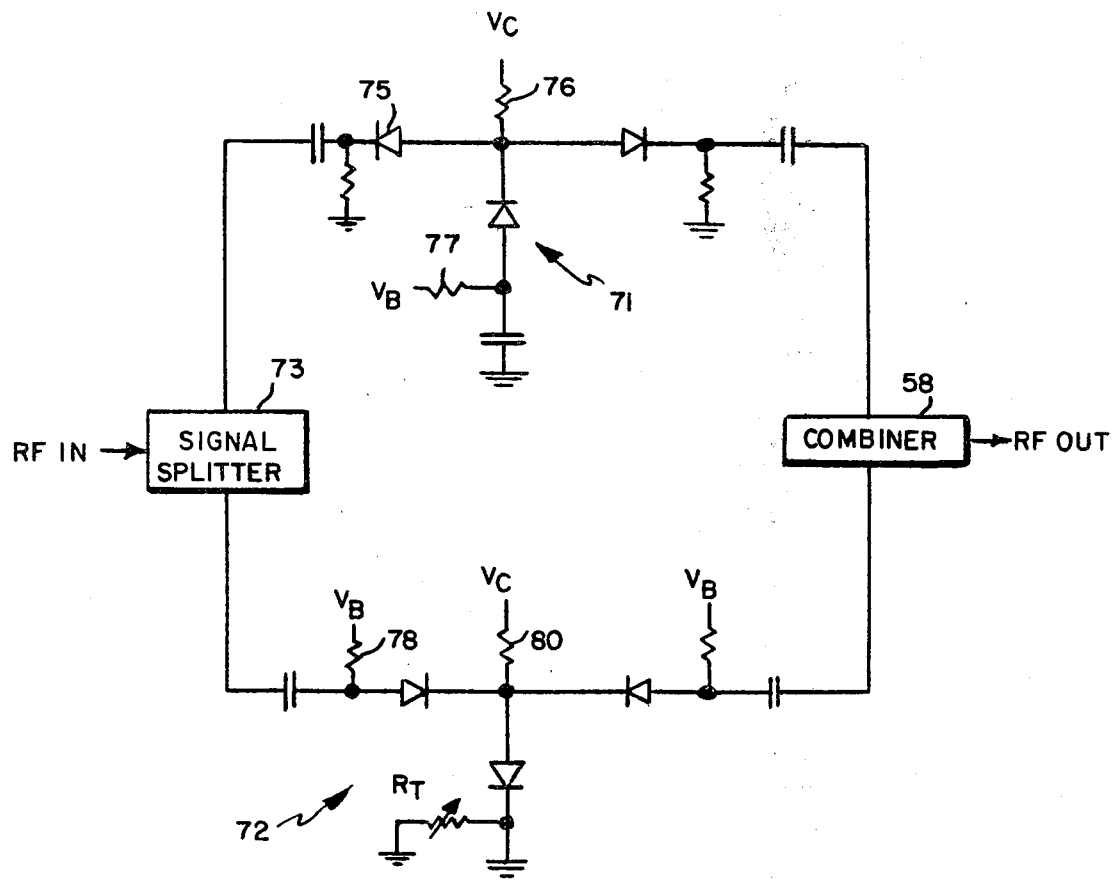

FIG. 8 represents a further simplification of the T-network configuration of FIG. 7 obtained by reversing the diode in the left-hand arm of upper T-network 71 and supplying $V_C$ directly to the diode in each branch of the T-network via a single resistor 76, while supplying $V_B$ via resistor 77. In lower T-network 72, $V_C$ is supplied to each diode via a single resistor 80, $V_B$ is supplied via resistors 78 and 79 and the diodes in the lower and right-hand arms thereof are reversed. By combining the resistor functions and appropriately rearranging the polarities of the diodes, the T-networks can be simplified while the advantages of the biasing scheme can still be effectively realized.

In all of the above configurations it should be noted that each of the diodes therein is d-c isolated from the input and output signals by capacitors and the anodes of each diode are connected to a resistor which is in turn connected to the bias voltage $V_B$.

In the bridge circuits of FIGS. 5 and 6, the baseband input signal $V_C$ is connected to the anode of each diode via an appropriate resistance in a first pair of opposite legs of the bridge (legs 41A and 42C) and is connected to the cathode of each diode via an appropriate resistance in the remaining pair of opposite legs of the bridge (legs 41C and 42A). All other resistances are grounded.

Such connections make the resistances of the diodes in the opposite legs change in the same direction for a given change in $V_C$ and make the resistances of the diodes in adjacent legs change in opposite directions for a given change in $V_C$. Because the biasing scheme is effectively the same as used in and discussed with reference to FIG. 1, the diode characteristics can be matched by varying trim resistors $R_T$ in at least two of the branches, i.e., branches 41A and 42C.

The use of the bridge circuit configuration of FIGS. 5 and 6, as opposed to that of FIG. 1, permits the insertion loss of the overall circuit to be reduced significantly without degrading the linearity of the response to $V_C$. Moreover, the impedance seen by the RF input and RF output appears to be more constant with respect to $V_C$ than that found in FIG. 1 and would provide improved frequency response characteristics. The temperature sensitivity of the insertion loss may also be reduced, thereby providing better temperature compensation characteristics when using the temperature compensation circuitry of the type shown in FIG. 1 or may well provide sufficiently good temperature performance without the need for any such further temperature compensation.

The double-balanced, or double-ended, input configurations are further capable of rejecting the even-order higher harmonics of the RF input signal and would appear to supply better isolation between the baseband input signal $V_C$ and the RF input signal, although at the cost of an additional input transformer (signal splitter) element.

The invention is not to be limited to the particular embodiments shown and described above except as defined by the appended claims.

What is claimed is:

1. A bridge circuit having four branches, first and second input terminals and first and second output terminals, said circuit for processing a first signal and a second signal,
   each branch of said bridge circuit including
      a current controllable resistance means having a first and second terminal; and
      capacitance means for providing d-c isolation thereof;
   first input circuit means for applying said first signal as an input signal to at least one of said first and second input terminals of said bridge circuit;
   bias circuit means for applying the same bias voltage to the first terminal of the current controllable resistance means of each of said branches;
   second input circuit means for applying said second signal to the first terminal of the current controllable resistance means of a first pair of opposite branches of said bridge circuit and to the second terminal of the current controllable resistance means of the other pair of opposite branches of said bridge circuit;
   output circuit means responsive to the signals at the first and second output terminals of said bridge circuit for combining said signals to produce an output signal which is the product of said first signal and said second signal.

2. A bridge circuit in accordance with claim 1 and further including
   a first further circuit connected between said at least one input terminal and ground, said first further circuit including
      a current controllable resistance means having first and second terminals, said bias voltage being supplied to the first terminal thereof and the second signal being supplied to the second terminal thereof; and
      capacitance means for providing d-c isolation of said first further circuit; and
   a second further circuit means connected between said at least one input terminal and ground, said second further circuit including
      a current controllable resistance means having first and second terminals, said bias voltage and said second signal being supplied to said first terminal thereof; and
      capacitance means for providing d-c isolation of said second further circuit.

3. A bridge circuit in accordance with claim 1 wherein said bias circuit means includes separate means for supplying said bias voltage separately to the current controllable resistance means in each of said branches.

4. A bridge circuit in accordance with claim 1 wherein said bias circuit means includes separate means for supplying said bias voltage separately to the current controllable resistance means in two of said branches and further including
   inductance coupling means for supplying said voltage to the current controllable resistance means in the other two of said branches.

5. A bridge circuit in accordance with claim 1 wherein said second input circuit means includes separate means for supplying said second signal separately to the current controllable resistance means in each of said branches.

6. A bridge circuit in accordance with claim 4 and further wherein said second input circuit means includes separate means for supplying said second signal separately to the current controllable resistance means in two of said branches, said inductance coupling means supplying said second signal to the current controllable resistance means in the other two of said branches.

7. A bridge circuit in accordance with claims 1, 2, 3, 4, 5 or 6 wherein said first signal is supplied to said first input terminal and said second input terminal is grounded.

8. A bridge circuit in accordance with claims 1, 2, 3, 4, 5 or 6 wherein said first signal has a first component and a second component opposite in phase to said first component, said first component being supplied to said first input terminal and said second component being supplied to said second input terminal.

9. A bridge circuit in accordance with claim 1 and further including
   a first further circuit connected between said first output terminal and said combining means, said first further circuit including
      a current controllable resistance means having first and second terminals, said bias voltage and said second signal being supplied to said first terminal thereof;
      capacitive means for providing d-c isolation of said first further circuit; and
   a second further circuit connected between said second output terminal and said combining means, said second further circuit including
      a current controllable resistance means having first and second terminals, said bias voltage being supplied to the first terminal thereof and said second signal being supplied to the second terminal thereof; and
      capacitive means for providing d-c isolation of said second further circuit.

10. A bridge circuit in accordance with claim 9 wherein said bias voltage is separately supplied to said first terminal of the current controllable resistances of said bridge circuit and said first and second further circuits by separate bias circuits and said second signal is supplied to the first or second terminals of the current controllable resistances in said bridge circuit and said first and second further circuits by separate input circuits.

11. A bridge circuit in accordance with claim 9 wherein said first two adjacent branches of said bridge circuit and said first further circuit means form three legs of a first T-network configuration and the other two adjacent branches of said bridge circuit and said second further circuit form three legs of a second T-network configuration;

said second signal being supplied to the current controllable resistances of the legs of said first T-network configuration by a first signal input circuit and to the current controllable resistances of the legs of said second T-network configuration by a second signal input circuit; and said bias voltage being applied to the current controllable resistances of the legs of said first T-network configuration by a first bias circuit and to the current controllable resistances of the legs of said second T-network configuration by a second bias circuit.

12. A bridge circuit in accordance with claims 1, 2, 3, 4, 5, 6, 9, 10 or 11 wherein said current controllable resistances are diodes.

13. A bridge circuit in accordance with claim 7 wherein said current controllable resistances are diodes.

14. A bridge circuit in accordance with claim 8 wherein said current controllable resistances are diodes.

15. A bridge circuit in accordance with claim 12 wherein the first terminal of each of said diode means is an anode terminal and the second terminal of each of said diode means is a cathode terminal.

16. A bridge circuit in accordance with claim 12 wherein said diodes are PIN diodes.

17. A bridge circuit in accordance with claim 13 wherein the first terminal of each of said diode means is an anode terminal and the second terminal of each of said diode means is a cathode terminal.

18. A bridge circuit in accordance with claim 14 wherein the first terminal of each of said diode means is an anode terminal and the second terminal of each of said diode means is a cathode terminal.

* * * * *